(12) United States Patent
Wang et al.

(10) Patent No.: US 7,436,224 B2
(45) Date of Patent: Oct. 14, 2008

(54) LOW VARIATION VOLTAGE OUTPUT DIFFERENTIAL FOR DIFFERENTIAL DRIVERS

(75) Inventors: Yanbo Wang, Shanghai (CN); Hongquan Wang, Shanghai (CN); Xuexin Ding, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 69 days.

(21) Appl. No.: 11/494,847

(22) Filed: Jul. 27, 2006

(65) Prior Publication Data

US 2008/0024176 A1  Jan. 31, 2008

(51) Int. Cl.
*H03B 1/00* (2006.01)
(52) U.S. Cl. .................. 327/108; 327/111; 323/246
(58) Field of Classification Search ............. 327/111, 327/108; 323/246
See application file for complete search history.

(56) References Cited

U.S. PATENT DOCUMENTS

| 5,585,748 | A   | * | 12/1996 | Yamaguchi et al. | 327/101 |
| 6,215,290 | B1  | * | 4/2001  | Yang et al.      | 323/282 |
| 6,480,043 | B2  | * | 11/2002 | Hall et al.      | 327/108 |
| 6,504,423 | B2  | * | 1/2003  | Riggio et al.    | 327/560 |
| 6,657,903 | B2  |   | 12/2003 | Sung             |         |
| 7,230,406 | B2  | * | 6/2007  | Huang et al.     | 323/222 |
| 2006/0055414 | A1 |  | 3/2006  | Vincent et al.   |         |

* cited by examiner

*Primary Examiner*—N. Drew Richards
*Assistant Examiner*—An T. Luu
(74) *Attorney, Agent, or Firm*—Finnegan, Henderson, et al.

(57) ABSTRACT

The methods and systems presented herein provide an improved means of correcting the variation of Voltage Output Differential (VOD) in differential drivers. In some embodiments, a high-precision reference voltage is generated not only based on a desired VOD, but also by monitoring the Voltage Common Mode (VCM) in a differential driver. In some embodiments, the VOD is then compared with the high-precision reference voltage to correct the output current. The result is a low-variation output voltage.

18 Claims, 6 Drawing Sheets

LOW VARIATION VOLTAGE OUTPUT DIFFERENTIAL FOR DIFFERENTIAL DRIVERS

BACKGROUND

1. Field of the Invention

The present invention is related to differential drivers and, in particular, to methods and systems for an improved method of correcting the variation of Voltage Output Differential (VOD) due to process and temperature variations in differential drivers.

2. Description of Related Art

A differential driver is an electronic device, commonly an integrated circuit, which is used to drive complementary signals that are carried on pairs of conductors. Differential drivers are commonly used for driving lines that may interconnect, for example, integrated circuits, peripheral devices, or traces. Differential drivers are also commonly used in clock circuits and in Multipoint Low-Voltage Differential Signaling (MLVDS) applications. MLVDS systems provide high-speed, low-power signal processing for such applications as wireless base stations, Digital Subscriber Line Access Multiplexers (DSLAMs), handheld consumer electronics, and other telecommunications equipment.

Differential signals are commonly referenced to each other, rather than to a source of ground potential or other reference voltage. In some systems, one signal (i.e., a first voltage between the two conductors) may be referenced as "high" or "positive" and the other signal (i.e., a second voltage between the two conductors) as "low" or "negative."

The average voltage of a differential signal defines that signal's "common-mode" voltage. To ensure proper operation of the differential input and output drivers in a high-speed link, the voltage swing (i.e., the amount that a particular voltage varies over time) of each of the differential signals and the common-mode voltage of each signal should remain within certain prescribed ranges.

In the field of differential drivers, the Output Differential Voltage (VOD) is typically defined by driving a constant output current through an external load resistor. The resistor in such a system typically has a large range of resistance—changing plus or minus 20% with process and temperature. The result of such high variation in the system can be an unstable VOD that can greatly reduce the performance of the output driver by, for example, reducing the noise immunity of the system.

Therefore, there is a need for methods and systems for an improved variation in output currents, and consequently the Voltage Output Differential (VOD), in differential drivers.

SUMMARY

In accordance with the present invention, methods and systems for an improved correction of the variation of Voltage Output Differential drivers are presented. A differential driver system according to the present invention may include a reference voltage circuit that generates a reference voltage, a sampler voltage circuit for choosing a sample voltage by monitoring the output voltage at two terminals of an external load resistor, and a compensation circuit for controlling an actual output voltage at least in part by generating a compensation current. The reference voltage may be equal to half of a desired output voltage, based on a common-mode voltage of the actual output voltage; or equal to the common-mode voltage plus or minus one-half of the desired output voltage. The sampler voltage circuit may choose the higher or lower voltage value of the two terminals to be the sample voltage. The compensation circuit may compare the reference voltage with the sample voltage and set the compensation current such that the actual output voltage is equal to a desired value.

Further, a Multipoint Low-Voltage Differential Signaling (MLVDS) system according to the present invention may incorporate any combination of components and limitations listed above for a differential driver system. Further, the sample voltage of a MLVDS system according to the present invention may be set to the voltage at a switch MOSFET that is used to control an output source or a sink current. Alternatively, the sample voltage may be set to the voltage at a switch MOSFET that is used to control whether or not a driver is coupled to a bus.

A method of driving a differential line according to the present invention may comprise generating a reference voltage; choosing a sample voltage by monitoring the output voltage at two terminals of an external load resistor; and controlling an actual output voltage at least in part by generating a compensation current. The reference voltage may be equal to half of a desired output voltage, based on a common-mode voltage of the actual output voltage; or equal to the common-mode voltage plus or minus one-half of the desired output voltage. The sample voltage may be the higher or lower voltage value of the two terminals. Alternatively, the sample voltage may be set to the voltage at a switch MOSFET that is used for any of: controlling an output source, controlling a sink current, or controlling whether or not a driver is coupled to a bus. Further, the controlling step may comprise comparing the reference voltage with the sample voltage and setting the compensation current such that the actual output voltage is equal to a desired value.

BRIEF DESCRIPTION OF THE DRAWINGS

Wherever possible, the same reference numbers will be used throughout the drawings to refer to the same or like parts.

DETAILED DESCRIPTION

Figure 1:
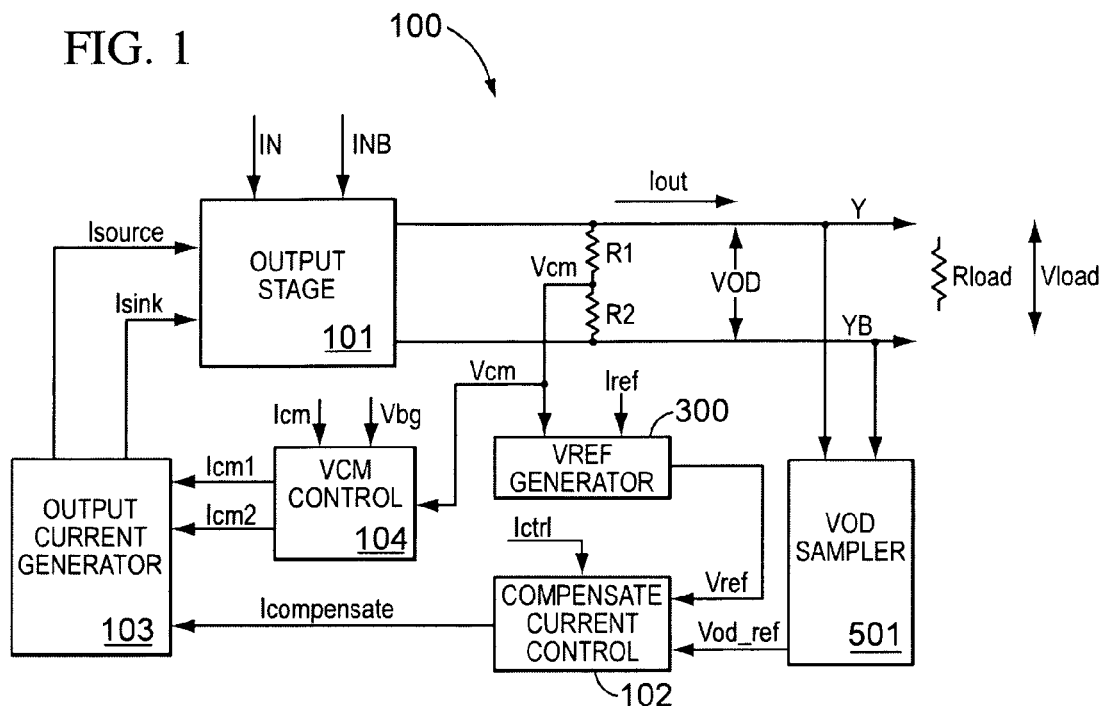
FIG. 1 shows a block diagram of a differential driver according to some embodiments of the present invention.

FIG. 1 shows a block diagram of an example differential driver 100 according to some embodiments of the present invention. Differential driver 100 includes output stage 101. Output stage 101 receives differential input currents IN and INB and outputs current Iout in response. Output stage 101 also adjusts current Iout in response to Isource and Isink so that the Voltage Output Differential (VOD) (i.e., the voltage across the output terminals of output stage 101 when a load resistance Rload is coupled to the output terminals) of output stage 101 is substantially free from temperature variations and the VOD in different differential drivers 100 are substantially free of variations due to process differences between different drivers.

In order to control the variations in VOD, differential driver 100 includes a Voltage Reference (VREF) Generator circuit 300 that generates a reference voltage Vref, a Voltage Output Differential (VOD) Sampler Unit 501 that provides an output reference voltage Vod_ref, a Compensate Current Control (CCC) circuit 102 that generates a compensation current Icompensate, a Voltage Common Mode (VCM) Control circuit 104 that generates common-mode current components Icm1 and Icm2, and an Output Current Generator circuit 103 that provides currents Isource and Isink to Output Stage 101 that generates the output signals. Load resistor Rload represents the impedance to which differential driver 100 is coupled.

In some embodiments of the present invention, such as that shown in FIG. 1, the variation of the output current Iout from output stage 101 is monitored and corrected to maintain a desired VOD. A high-precision reference voltage based on the desired VOD can be generated in VREF Generator 300, which may include a band-gap circuit in order to also monitor process variations. The output voltage of driver 100 can be sampled by monitoring the VOD in VOD Sampler Unit 501. By comparing the sampled output voltage with a reference voltage Vref, the output current Iout can be corrected to compensate for variation in VOD, for example due to temperature or process changes. VCM Control circuit 104 can monitor and control the common mode of differential driver 100. In general, the voltages at the two terminals of load resistor Rload are given by the common mode voltage Vcm plus or minus one-half of the differential voltage VOD.

As indicated above, signals are communicated through differential driver 100 by setting particular values of VOD to indicate particular symbols, for example a positive VOD being a logic 1 and a negative VOD being a logic 0. In some cases, signaling can be determined by setting the VOD at multiple voltage blocks. The sample VOD can be taken on the load resistor Rload because Rload is the only component of driver 100 that is not affected by the process. As shown in FIG. 1, VOD can be monitored by a voltage divider coupled between two output terminals Y and YB. The generated voltage Vcm can be affected by offsets in driver 100, process variations between drivers, and temperature variations, which will also negatively affect the integrity of voltages at the two terminals of the load resistor. A reference voltage, Vref, which is based on the desired VOD, varies by the same amount as does Vcm. This variation can be used to cancel out variations in the differential driver circuit 100 due to offset, process, and temperature. The only remaining variation, then, is that inherent in the VREF Generator circuit 300, which can be managed at a level of 3% or below. This resulting control on the variation can lead to a high-precision driver in some embodiments.

Referring again to FIG. 1, driver 100 outputs a current Iout to load resistors Rload. The current Iout has two components: a common mode current Icm and a signal current Isig The common mode current Icm is related to the common mode voltage Vcm by:

$$Icm = Vcm/Rload \quad (1)$$

The signal current is related to the VOD by:

$$Isig = VOD/Rload \quad (2)$$

As shown in FIG. 1, the common-mode current Icm is input to Voltage Common Mode (VCM) circuit 104, which operates to stabilize the common mode of differential driver 100. The second component of Iout is the compensation current Icompensate, which is determined by comparing the reference voltage Vref from VREF Generator 300 with the sampled voltage Vod_ref from VOD Sampler Unit 501.

In the example differential driver 100 illustrated in FIG. 1, the Output Current Generator circuit 103 receives inputs Icm1 and Icm2 from VCM Control circuit 104, receives input Icompensate from Compensate Current Control circuit 102, and supplies the source (Isource) and sink (Isink) currents to Output Stage circuit 101. VCM Control circuit 104 may be configured such that Isource is equal to Icm1 plus Icompensate and Isink is equal to Icm2 plus Icompensate. In the ideal state, Isource and Isink are equal to each other. Icm1 and Icm2 may be tuned to compensate for process, voltage, and temperature variations and keep Isource and Isink equal.

$$Isource = Icm1 + Icompensate \quad (3)$$

$$Isink = Icm2 + Icompensate \quad (4)$$

In the example differential driver 100, the Compensate Current Control (CCC) circuit 102 may help to maintain the desired current conditions for Output Current Generator 103. CCC 102 strictly monitors the two compared voltages Vref and Vod_ref and adjusts the Icompensate current appropriately so that the sampled reference voltage Vod_ref equals Vref. As described above, it is important that the reference voltages vary with Vcm in order to cancel out offset, process, and temperature variations in driver 100. In order to maintain a low-variation VOD, the circuit may be designed so that reference voltage Vref is common mode voltage Vcm plus or minus one-half of the desired VOD:

$$Vref = Vcm \pm VOD\_desired/2 \quad (5)$$

VOD Sampler Unit 501 is designed such that the sampled Vod_ref is Vcm plus or minus one-half of the actual voltage Vload across the load resistor:

$$Vod\_ref = Vcm \pm Vload/2 \quad (6)$$

Note that both values are based on Vcm. Thus, the voltage comparison is, in fact, made between the desired voltage value and the actual result voltage across the load resistor. If VOD is larger than the desired value, CCC 102 will reduce Icompensate an appropriate amount to lower VOD to the desired value. Similarly, if VOD is smaller than the desired value, CCC 102 will increase Icompensate an appropriate amount to raise VOD to the desired value. Note that because VOD_desired comes from VREF Generator 300 (the band-gap circuit) and the load resistor is external, they are not greatly affected by process variations. A feedback compensate loop comprising VCM Control circuit 104 forces the output voltage Vload on the load resistor to be equal to the desired VOD. The variation between Vload and desired VOD is the same as the variation inherent in the VREF Generator 300 itself, which is easily kept less than 3% because band-gap circuits with such low variation are well-known in the art. The result is a low-variation VOD.

Figure 2:
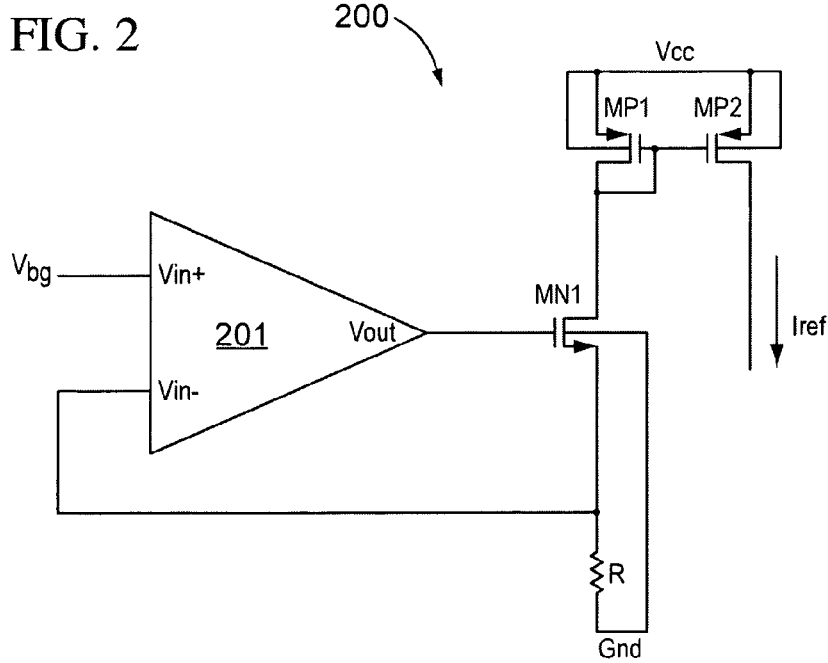
FIG. 2 shows a schematic diagram of an example reference current generator circuit according to some embodiments of the present invention.

FIG. 2 shows a schematic diagram of an example Reference Current Generator circuit 200 according to some embodiments of the present invention. Reference Current Generator circuit 200 may output current Iref to driver circuit 100. The present example circuit comprises op-amp 201, PMOS transistors MP1 and MP2, NMOS transistor MN1, and resistor R. The input voltage to op-amp 201 is connected to the same as node Vbg as shown in FIG. 1. The current Iref generated by this circuit may be supplied to VREF Generator 300. Iref may be equal to the band-gap voltage Vbg (see FIG. 1) divided by the resistance of resistor R.

$$Iref=Vbg/R \quad (7)$$

Note that band-gap voltage Vbg has little relation with the process variations and its value may easily vary by less than 3%. However, resistor R is greatly affected by process and temperature variations. The potential for voltage and current variation in circuit 200 and differential driver 100 comes primarily from resistor R, the resistance of which may vary by as much as 20%, depending on process and temperature variations. The variation of reference current Iref is due primarily to this variation in the resistance of resistor R. The common-mode current Icm (FIG. 1) and the control current Ictrl (FIG. 1) are both mirrored from Iref.

Figure 3:
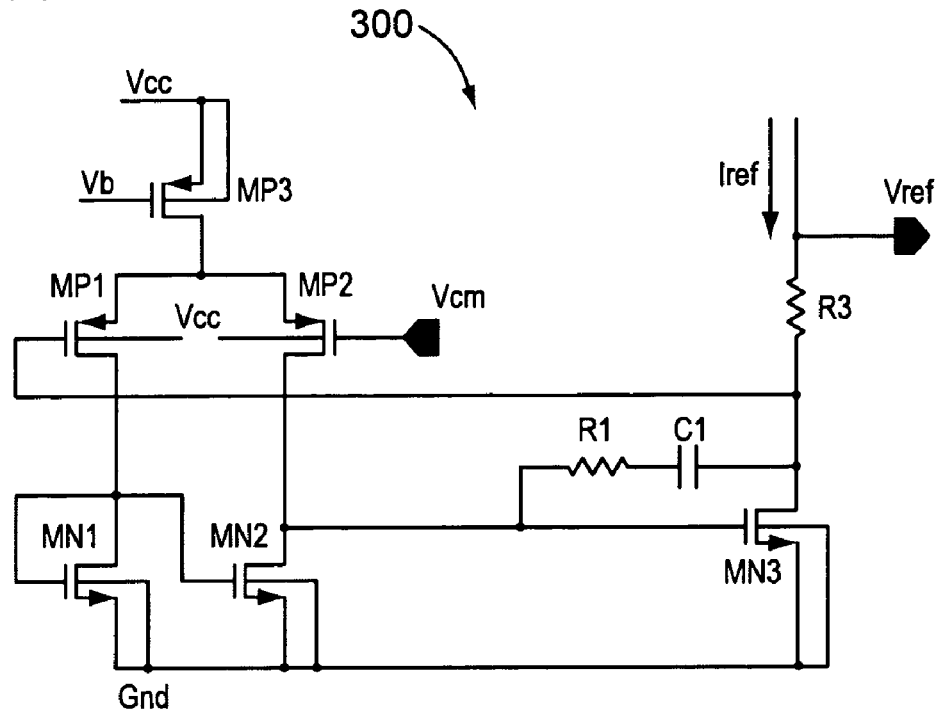
FIG. 3 shows a schematic diagram of an example reference voltage generator circuit according to some embodiments of the present invention.

FIG. 3 shows a schematic diagram of one possible reference voltage generator circuit 300 according to some embodiments of the present invention. Reference voltage generator circuit 300 supplies a reference voltage Vref, which has two components: Vcm and Iref*R3. Vcm is highly susceptible to variation due to process, voltage, and temperature variations, while Iref*R3 is not, for the reasons discussed below. In some embodiments, Vref may be equal to Iref multiplied by the resistance of resistor R3, plus the common-mode voltage Vcm:

$$Vref=Vcm+(Iref*R3) \quad (8)$$

If R3 is the same type of resistor as R, R3 will have the same variations in resistance, described above, as R. When variations of the resistors are similar or identical, the variations may essentially cancel each other out. Consequently, reference voltage Vref and band-gap voltage Vbg may also share the same canceling relationship. Combining equations (5) and (8), the product of Iref and R3 can also be expressed as one-half of the desired VOD:

$$(Iref*R3)=VOD\_desired/2 \quad (9)$$

Combining VREF Generator 300 with Reference Current Generator 200 may yield a Vref with, for example, a variation less than 3%.

Figure 4:
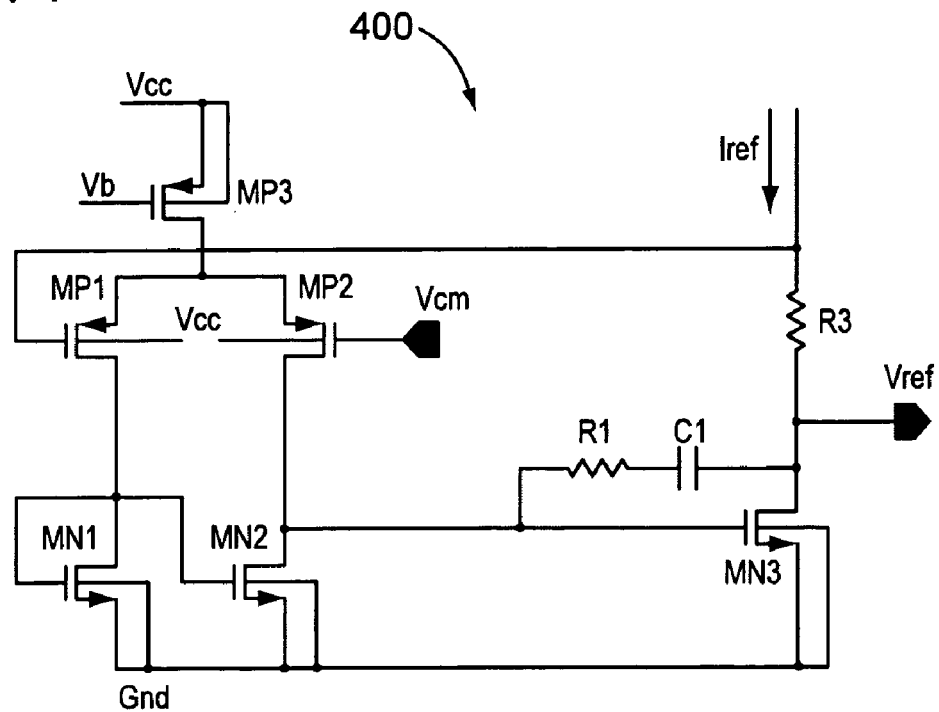
FIG. 4 shows a schematic diagram of another example reference voltage generator circuit according to some embodiments of the present invention.

FIG. 4 shows a schematic diagram of another example VREF Generator circuit 400 according to some embodiments of the present invention. In this example circuit, Vref is equal to Vcm minus the product of Iref multiplied by the resistance of R3:

$$Vref=Vcm-(Iref*R3) \quad (10)$$

With this example VREF Generator 400, the same low variation of Vref is achieved as described above with reference to VREF Generator 400, only the absolute value of the voltage Vref in this example is opposite that of the example circuit of FIG. 3.

Figure 5:
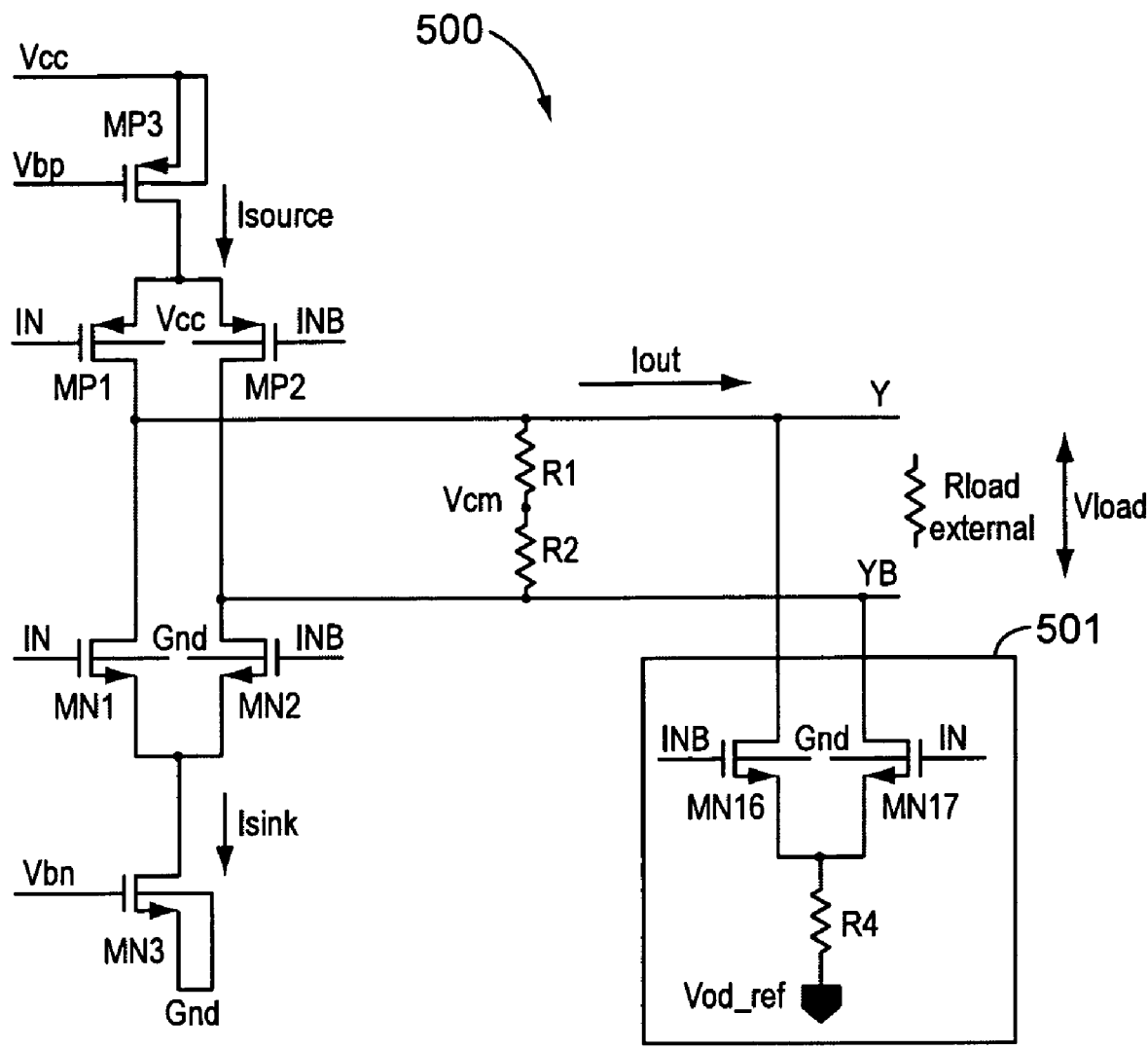
FIG. 5 shows a schematic diagram of an example Voltage Output Differential (VOD) sampler circuit according to some embodiments of the present invention.

FIG. 5 shows a schematic diagram of example VOC sampler circuit 500 according to some embodiments of the present invention. VOD sampler circuit 500 supplies sample voltage (Vod_ref) on the external resistor Rload. Vod_ref has two components: Vcm (as shown in FIGS. 1 and 3) and Vload/2. The figure comprises VOD Sampler Unit 501 and part of the circuitry comprising Output Current Generator 103 and Output Stage 101. By using a low-variation Vref, generated, for example, by a VREF Generator circuit 300 as described above, one may ensure a high-precision VOD by utilizing a sampler circuit such as the present example.

Referring again to FIG. 5, when current IN is high and current INB is low, NMOS transistors MN1 and MN17 and PMOS transistor MP2 turn on. Vod_ref may then be sampled at node YB. The sampled voltage Vod_ref in the example circuit 500 may be equal to Vcm plus one-half Vload:

$$Vod\_ref=Vcm+Vload/2 \quad (11)$$

When current IN is low and current INB is high, NMOS transistors MN2 and MN16 and PMOS transistor MP1 turn on. Vod_ref may then be sampled at node Y. Equation 11 above still holds for this case.

Note that if the output current is held constant, Vod_ref will have no variation with process because Rload is external and thus has no relationship with the process. If driver 100 lacks a feedback control circuit for the output current, VOD may have the same variation as the output current—as high as plus or minus 20%. If the sample point is set at the source of MP1, the sampled VOD may vary with the process because the impedance of MP1 changes with the process. However, if the impedance of MP1 is high, the variation will tend to be smaller. Therefore, the impedance of MP1 may be high to reduce variations in the driver.

Figure 6:
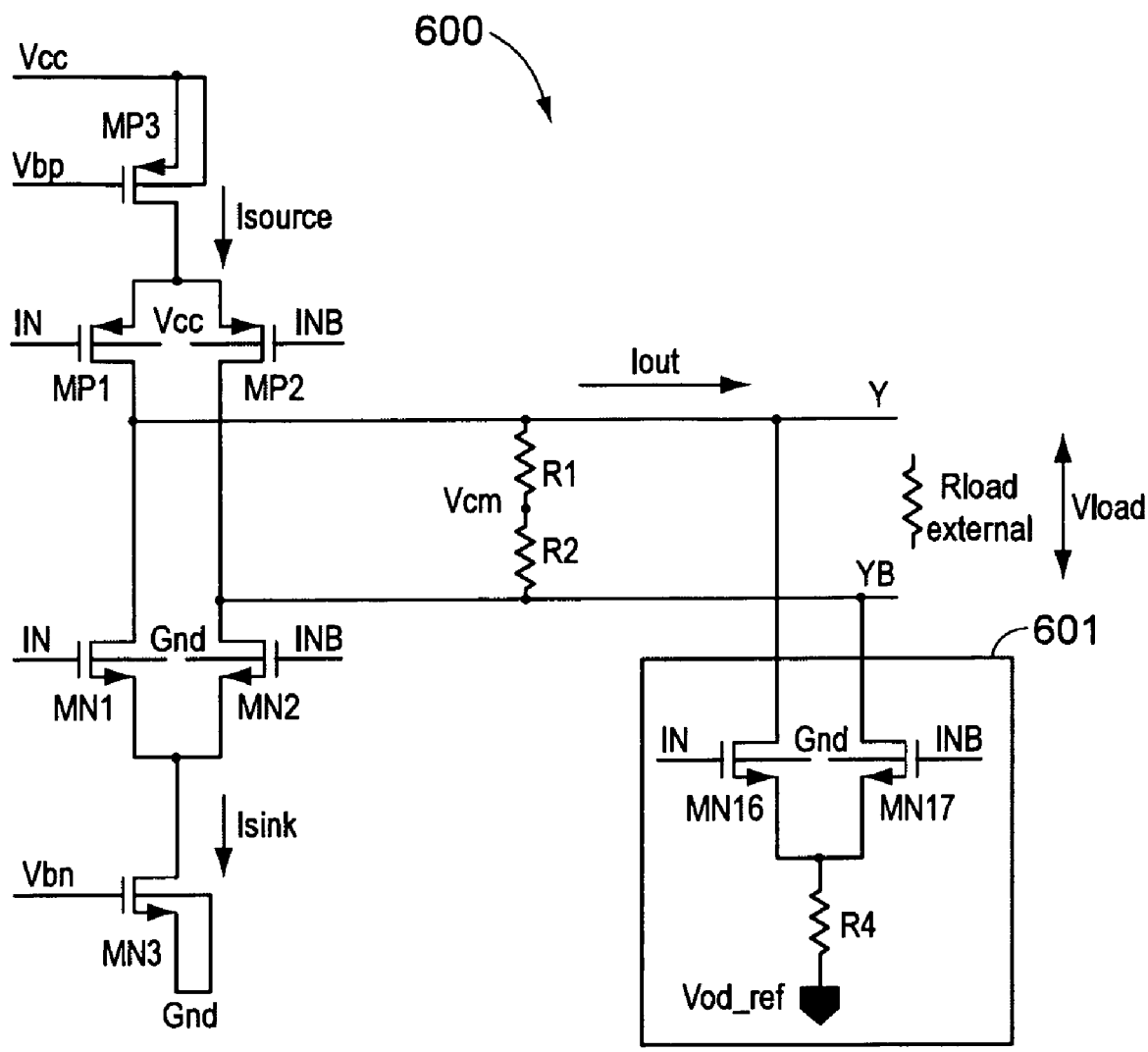
FIG. 6 shows a schematic diagram of another example VOD sampler circuit according to some embodiments of the present invention.

FIG. 6 shows a schematic diagram of another examplary VOD Sampler circuit 600 according to some embodiments of the present invention. The principles as discussed above with respect to FIG. 5 and VOD sampler circuit 500 hold true for VOD sampler circuit 600, with the exception that in the present example circuit VOD sampler circuit 600, Vod_ref is equal to Vcm minus one-half Vload:

$$Vod\_ref=Vcm-Vload/2 \quad (12)$$

As explained above, an exemplary driver 100 may incorporate a low-variation VREF Generator 300 or 400 and may incorporate a VOD sampler circuit 500 or 600. Those blocks have little or no relation with the process, and thus may not be greatly affected by the various process variations. Driver 100 may incorporate a feedback loop to force output voltage differential VOD to be the same as reference voltage Vref. The output current Iout from VOD sampler circuit 500 and 600 may then be controlled and corrected to cancel out the process variations. The precision of the output result Iout, then, may be directly proportional to the precision of Vref.

Figure 7:
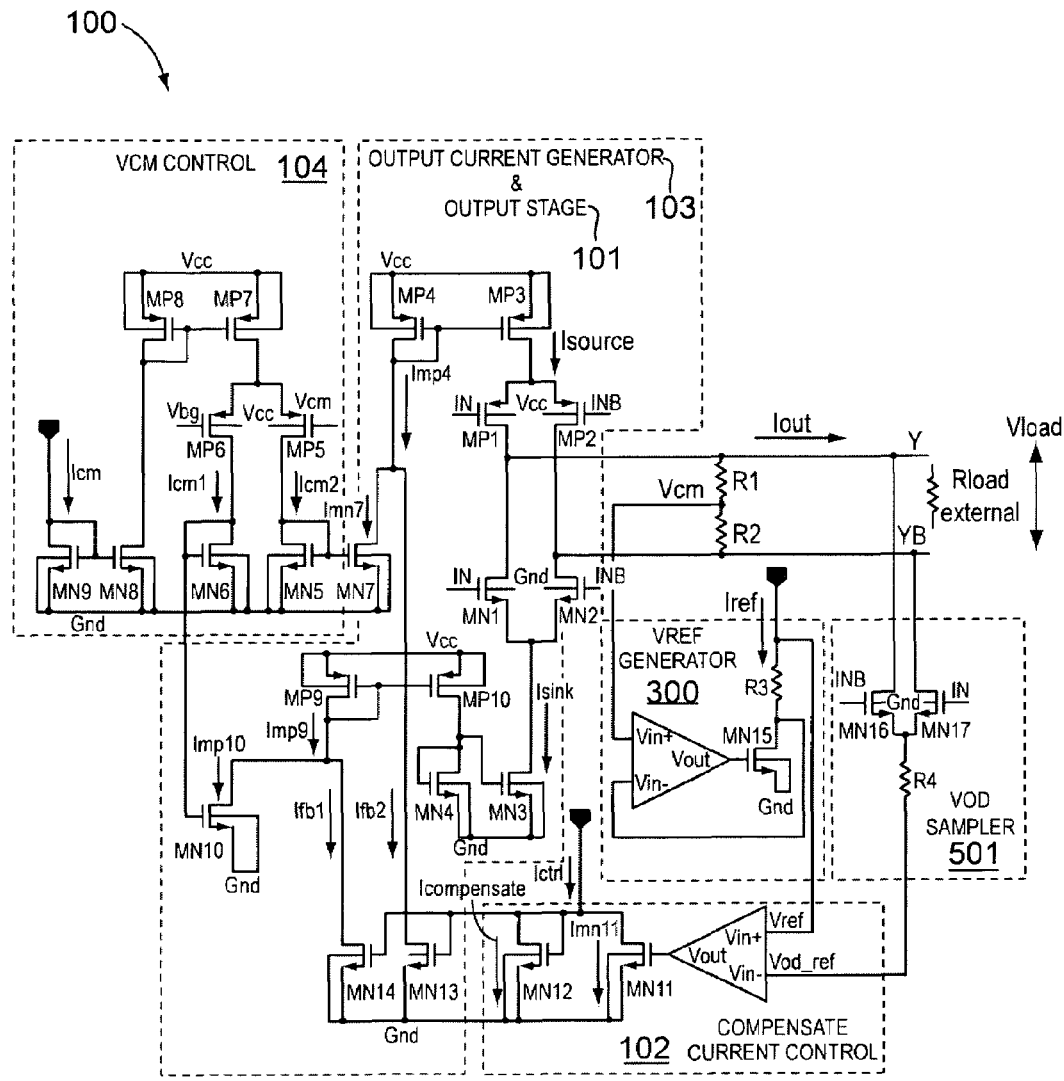
FIG. 7 shows a schematic diagram of a differential driver according to some embodiments of the present invention.

FIG. 7 shows a schematic diagram of an example differential driver 100 according to some embodiments of the present invention. The general architecture of driver 100 includes two primary feedback loops. The first loop is the common-mode loop, which controls the common mode of the driver and supplies part of the output current. The distinguishing unit of the common-mode loop is VCM Control circuit 104. The second feedback loop is the current-compensate loop, which controls the compensation current to ensure that the sampled VOD is the same as Vref. The distinguishing units of the current-compensate loop are VREF Generator 300, VOD Sampler Unit 501, and CCC 102. The current-compensate loop supplies the other part of the output current. Output Current Generator 103 and Output Stage 101 may be coupled to either or both feedback loops. In FIG. 1, Output Current Generator 103 and Output Stage 101 are coupled to both the common-mode and current compensate loops.

The FIG. 7 schematic diagram of driver 100 shows the circuitry with more precision. Source current Isource is equal to Imp4 plus Ifb2, Imp4 is equal to Icm2, and Ifb2 is equal to Icompensate.

$$I\text{source}=I\text{mp}4+I\text{fb}2 \quad (13)$$

$$I\text{mp}4=I\text{cm}2 \quad (14)$$

$$I\text{fb}2=I\text{compensate} \quad (15)$$

Combining equations 13, 14, and 15, Isource is the sum of Icm2 and Icompensate.

$$I\text{source}=I\text{cm}2+I\text{compensate} \quad (16)$$

The sink current Isink is the sum of Icm1 and Icompensate.

$$I\text{sink}=I\text{cm}1+I\text{compensate} \quad (17)$$

If Vcm is assumed to be the same as Vbg, then Icm1 will be equal to Icm2 and Icm. Finally, the output current Iout is equal to the common-mode current Icm plus the compensation current Icompensate.

$$V\text{cm}=V\text{bg}\rightarrow I\text{cm}1=I\text{cm}2=I\text{cm} \quad (18)$$

$$I\text{out}=I\text{cm}+I\text{compensate} \quad (19)$$

The second loop to be analyzed is the loop-control circuit. Icm may vary with process and may not be controlled. Icompensate may be defined by the result of the comparison of Vod_ref and Vref. If Icm reaches a larger than normal value, Vod_ref is necessarily larger than Vref and thus the current Imn11 flowing into MN11 will be large. In such a case, Icompensate may then be reduced to correct the larger-than-normal Icm and force Vod_ref to once again be equal to Vref. Similarly, if Icm falls to a value smaller than normal, Vod_ref will be smaller than Vref. Imn11 will thus be the small and Icompensate may then be increased to correct the low Icm and force equality of Vod_ref and Vref. As discussed with reference to FIGS. 2 and 3, a Vref with low variation may be generated using this method. The loop-control circuitry ensures that Vod_ref will have the same variations with Vref, canceling the variation out each other out and ensuring that the output voltage will have a high precision regardless of process variations.

If Vcm were equal to Vbg under all conditions the VREF Generator 300 circuit would not be as useful. Vref could easily be calculated by adding the desired VOD to Vbg. In fact, however, Vcm can not equal to Vbg because of the offset in the common-mode control circuit and the Output State 101. The mirror results of all of the currents are inherently affected by the process and state of the transistors. In addition, there always exists an offset between Isource and Isink. As a result of these offsets, the Vcm may be pulled to deviate from Vbg to hold the balance. Vod_ref is always based on Vcm. If Vref is based on Vbg, then, the offset between Vbg and Vcm will appear at the output voltage and Vload on the load resistor will deviate from the desired value in proportion to the offset. This offset is random and cannot be forecast. This undesirable result is overcome in some embodiments of the present invention by setting both Vref and Vod_ref to the same voltage, which in the exemplary driver 100 is Vcm.

In some embodiments of the present invention, Vref and Vod_ref are always based on the value of Vcm regardless of whether Vcm is in fact equal to Vbg. The two voltages Vref and Vod_ref are compared in the feedback loop and Vod_ref is forced to be the same as Vref. The variation of VOD, then, will be proportional to that of Vref and will have little relation to the process. The desired value of Vref comes from a band-gap circuit that has a variation of 3% or less. The resulting output voltage of the driver will also have the same low variation.

Figure 8:
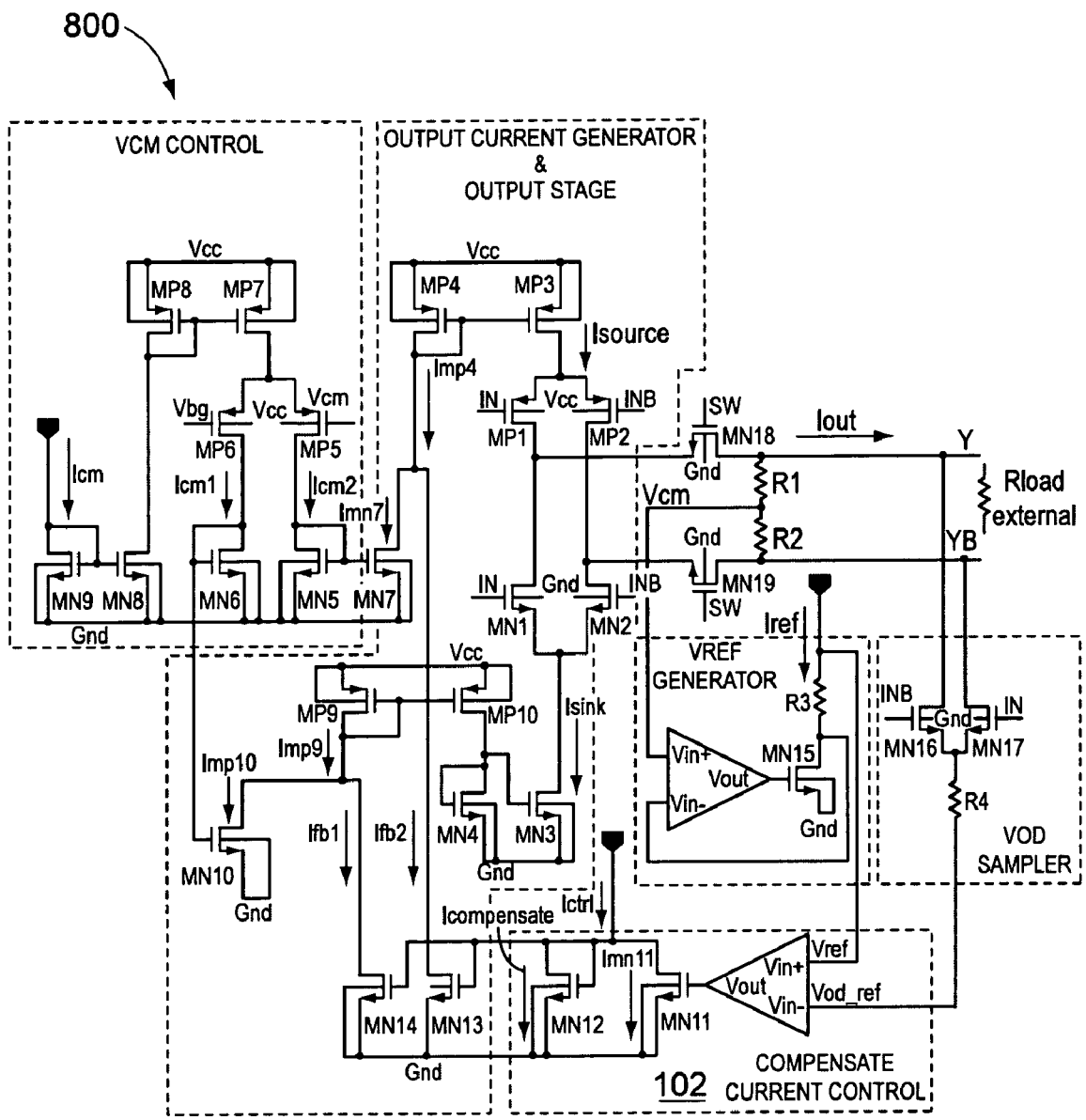
FIG. 8 shows a schematic diagram of a Multipoint Low Voltage Differential Signaling (MLVDS) driver according to some embodiments of the present invention.

FIG. 8 shows a schematic diagram of an example Multipoint Low Voltage Differential Signaling (MLVDS) driver 800 according to some embodiments of the present invention. MLVDS driver 800 may be similar or identical to driver 100, with the addition of NMOS transistors MN18 and MN19, which may be added to control MLVDS driver 800. The essential components and functions of MLVDS driver 800 are the same as those of differential driver 100 as described above. Consequently, only the changes introduced by MN18 and MN19 are discussed here.

When SW is high, MN18 and MN19 connect to the bus. Because Y and YB are on the bus, they are driven not only by MLVDS driver 800, but also by other circuits on the bus. Y and YB, and consequently Vcm, may be changed by the bus to depart from the normal value.

In a traditional MLVDS system, the difference between the common-mode and band-gap voltages is defined not only by the offset of the driver itself, but also is affected by other circuits on the bus. Hence the voltage difference may be larger than other differential driver circuits. When the reference voltage is biased to the band-gap voltage, the output voltage may run away and negatively affect the performance of the system if the variations in the system are large.

By applying the invention as described above, the process and temperature variations of the components of the chip are reduced to the lowest limit. With the present invention, one may achieve a low-variation voltage output differential in differential drivers, and especially in MLVDS drivers. This invention stabilizes the output voltage and greatly improves system performance.

Other embodiments of the invention will be apparent to those skilled in the art from consideration of the specification and practice of the invention disclosed herein. It is intended that the specification and examples be considered as example only, with a true scope and spirit of the invention being indicated by the following claims.

What is claimed is:

1. A differential driver system comprising:
   a reference voltage circuit that generates a reference voltage determined from a desired output voltage based on a common-mode voltage of the differential driver system;
   a sampler voltage circuit that generates a sample voltage by monitoring an output voltage across two terminals of an external load resistor; and
   a compensation circuit for controlling the output voltage at least in part by generating a compensation current based at least in part on the reference voltage and the sample voltage.

2. The differential driver system according to claim 1, wherein the reference voltage is equal to the sum of the common-mode voltage and one-half of the desired output voltage.

3. The differential driver system according to claim 1, wherein the reference voltage is equal to the common-mode voltage minus one-half of the desired output voltage.

4. The differential driver system according to claim 1, wherein the sample voltage is equal to the sum of the common-mode voltage of the differential driver system and one-half of the output voltage.

5. The differential driver system according to claim 1, wherein the sample voltage is equal to common-mode voltage of the differential driver system minus one-half of the output voltage.

6. The differential driver system according to claim 1, wherein the compensation circuit compares the reference voltage with the sample voltage and sets the compensation current such that the output voltage is equal to a desired value.

7. A Multipoint Low Voltage Differential Signaling (MLVDS) system comprising:

a reference voltage circuit that generates a reference voltage determined from a desired output voltage based on a common-mode voltage of the MLVDS system;

a sampler voltage circuit that generates a sample voltage by monitoring an output voltage across two terminals of an external load resistor; and a compensation circuit for controlling the output voltage at least in part by generating a compensation current based at least in part on the reference voltage and the sample voltage.

8. The MLVDS system according to claim 7, wherein the reference voltage is equal to the sum of the common-mode voltage and one-half of the desired output voltage.

9. The MLVDS system according to claim 7, wherein the reference voltage is equal to the common-mode voltage minus one-half of the desired output voltage.

10. The MLVDS system according to claim 7, wherein the sample voltage is equal to the sum of the common-mode voltage of the MLVDS system and one-half of the output voltage.

11. The MLVDS system according to claim 7, wherein the sample voltage is equal to the common-mode voltage of the MLVDS system minus one-half of the output voltage.

12. The MLVDS system according to claim 7, wherein the compensation circuit compares the reference voltage with the sample voltage and sets the compensation current such that the output voltage is equal to a desired value.

13. A method of driving a differential line, comprising:
generating a reference voltage determined from a desired output voltage based on a common-mode voltage of the differential line;
generating a sample voltage by monitoring an output voltage across two terminals of an external load resistor; and
controlling the output voltage at least in part by generating a compensation current based at least in part on the reference voltage and the sample voltage.

14. The method according to claim 13, wherein the reference voltage is equal to the sum of the common-mode voltage and one-half of the desired output voltage.

15. The method according to claim 13, wherein the reference voltage is equal to the common-mode voltage minus one-half of the desired output voltage.

16. The method according to claim 13, wherein the sample voltage is equal to the sum of the common-mode voltage of the deferential line and one-half of the output voltage.

17. The method to claim 13, wherein the sample voltage is equal to the common-mode voltage of the deferential line minus one-half of the output voltage.

18. The method according to claim 13, wherein the controlling step comprises comparing the reference voltage with the sample voltage and setting the compensation current such that the output voltage is equal to a desired value.

* * * * *